United States Patent
Han et al.

(10) Patent No.: US 10,658,326 B2
(45) Date of Patent: May 19, 2020

(54) BONDING WIRE HAVING A SILVER ALLOY CORE, WIRE BONDING METHOD USING THE BONDING WIRE, AND ELECTRICAL CONNECTION PART OF SEMICONDUCTOR DEVICE USING THE BONDING WIRE

(71) Applicant: SAMSUNG ELECTRONICS CO., LTD., Suwon-si, Gyeonggi-do (KR)

(72) Inventors: Won-Gil Han, Cheongju-si (KR); Sangho An, Suwon-si (KR); Yong Je Lee, Hawseong-si (KR); Jae Heung Lee, Cheonan-si (KR); Seungweon Ha, Cheonan-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 228 days.

(21) Appl. No.: 15/616,525

(22) Filed: Jun. 7, 2017

(65) Prior Publication Data

US 2018/0026004 A1   Jan. 25, 2018

(30) Foreign Application Priority Data

Jul. 20, 2016 (KR) .......................... 10-2016-0092131
May 12, 2017 (KR) .......................... 10-2017-0059484

(51) Int. Cl.
*H01L 23/00* (2006.01)
*H01L 25/065* (2006.01)

(52) U.S. Cl.
CPC .............. *H01L 24/48* (2013.01); *H01L 24/45* (2013.01); *H01L 24/85* (2013.01); *H01L 25/0657* (2013.01); *H01L 24/04* (2013.01); *H01L 24/05* (2013.01); *H01L 2224/04042* (2013.01); *H01L 2224/05571* (2013.01); *H01L 2224/05573* (2013.01); *H01L 2224/45015* (2013.01); *H01L 2224/4555* (2013.01); *H01L 2224/45139* (2013.01); *H01L 2224/45164* (2013.01); *H01L 2224/45565* (2013.01); *H01L 2224/45644* (2013.01); *H01L 2224/48091* (2013.01); *H01L 2224/48105* (2013.01); *H01L 2224/48138* (2013.01); *H01L 2224/48145* (2013.01);
(Continued)

(58) Field of Classification Search
CPC . H01L 2224/45139; H01L 2224/45164; H01L 2224/4554–45565; H01L 2224/45644; H01L 2224/4555; H01L 2224/4556
See application file for complete search history.

(56) References Cited

U.S. PATENT DOCUMENTS 6,042,712 A * 3/2000 Mathieu ............... B23K 20/004
205/209
7,645,522 B2   1/2010 Bischoff et al.
(Continued)

FOREIGN PATENT DOCUMENTS

KR       10-1004866      12/2010
KR    10-2013-0007021     1/2013
(Continued)

*Primary Examiner* — Kevin Parendo
(74) *Attorney, Agent, or Firm* — F. Chau & Associates, LLC

(57) ABSTRACT

A bonding wire includes a wire core including a silver-palladium alloy. A coating layer is disposed on a sidewall of the wire core. A palladium content of the silver-palladium alloy ranges from about 0.1 wt % to about 1.5 wt %.

19 Claims, 12 Drawing Sheets

(52) U.S. Cl.
CPC ............... *H01L 2224/48227* (2013.01); *H01L 2224/48228* (2013.01); *H01L 2224/48465* (2013.01); *H01L 2224/48471* (2013.01); *H01L 2224/78301* (2013.01); *H01L 2224/78621* (2013.01); *H01L 2224/85045* (2013.01); *H01L 2224/85055* (2013.01); *H01L 2224/85181* (2013.01); *H01L 2224/85203* (2013.01); *H01L 2224/85205* (2013.01); *H01L 2224/85207* (2013.01); *H01L 2224/85897* (2013.01); *H01L 2924/00014* (2013.01)

(56) References Cited

U.S. PATENT DOCUMENTS

| | | | |
|---|---|---|---|
| 8,729,395 B2 | 5/2014 | Lee | |
| 8,940,403 B2 | 1/2015 | Lee et al. | |
| 9,103,001 B2 | 8/2015 | Chiba et al. | |
| 2008/0240975 A1* | 10/2008 | Cho | C22C 5/06 420/503 |
| 2009/0294945 A1* | 12/2009 | Okada | H01L 21/561 257/686 |
| 2012/0263624 A1* | 10/2012 | Chiba | C22C 5/06 420/505 |
| 2013/0160902 A1 | 6/2013 | Lee | |
| 2013/0171470 A1* | 7/2013 | Lee | C22C 5/06 428/672 |
| 2013/0233593 A1 | 9/2013 | Lee et al. | |
| 2013/0233594 A1* | 9/2013 | Lee | H01L 24/43 174/126.2 |
| 2014/0063762 A1 | 3/2014 | Ryu et al. | |
| 2014/0302317 A1* | 10/2014 | Antoku | H01L 24/45 428/389 |
| 2015/0155252 A1* | 6/2015 | Milke | H01L 25/50 438/109 |
| 2015/0322586 A1 | 11/2015 | Lyn et al. | |
| 2015/0360316 A1 | 12/2015 | Milke et al. | |
| 2016/0035695 A1* | 2/2016 | Kumamoto | B23K 35/30 |
| 2016/0288272 A1* | 10/2016 | Lukas | B23K 35/30 |
| 2017/0256517 A1* | 9/2017 | Kim | H01L 24/43 |
| 2018/0076167 A1* | 3/2018 | Chuang | H01L 24/05 |

FOREIGN PATENT DOCUMENTS

| | | |
|---|---|---|
| KR | 10-1328863 | 11/2013 |
| KR | 10-2015-0109424 | 10/2015 |
| KR | 10-2015-0133679 | 11/2015 |

\* cited by examiner

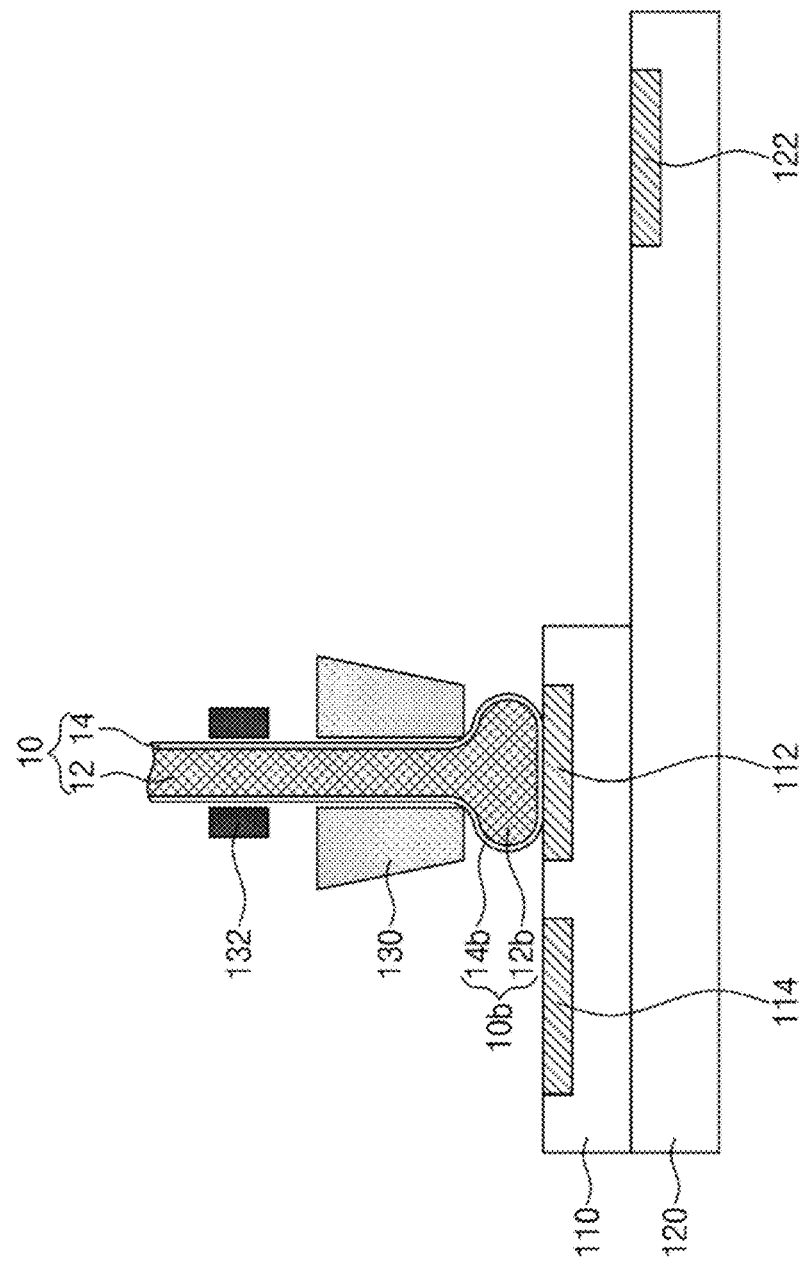

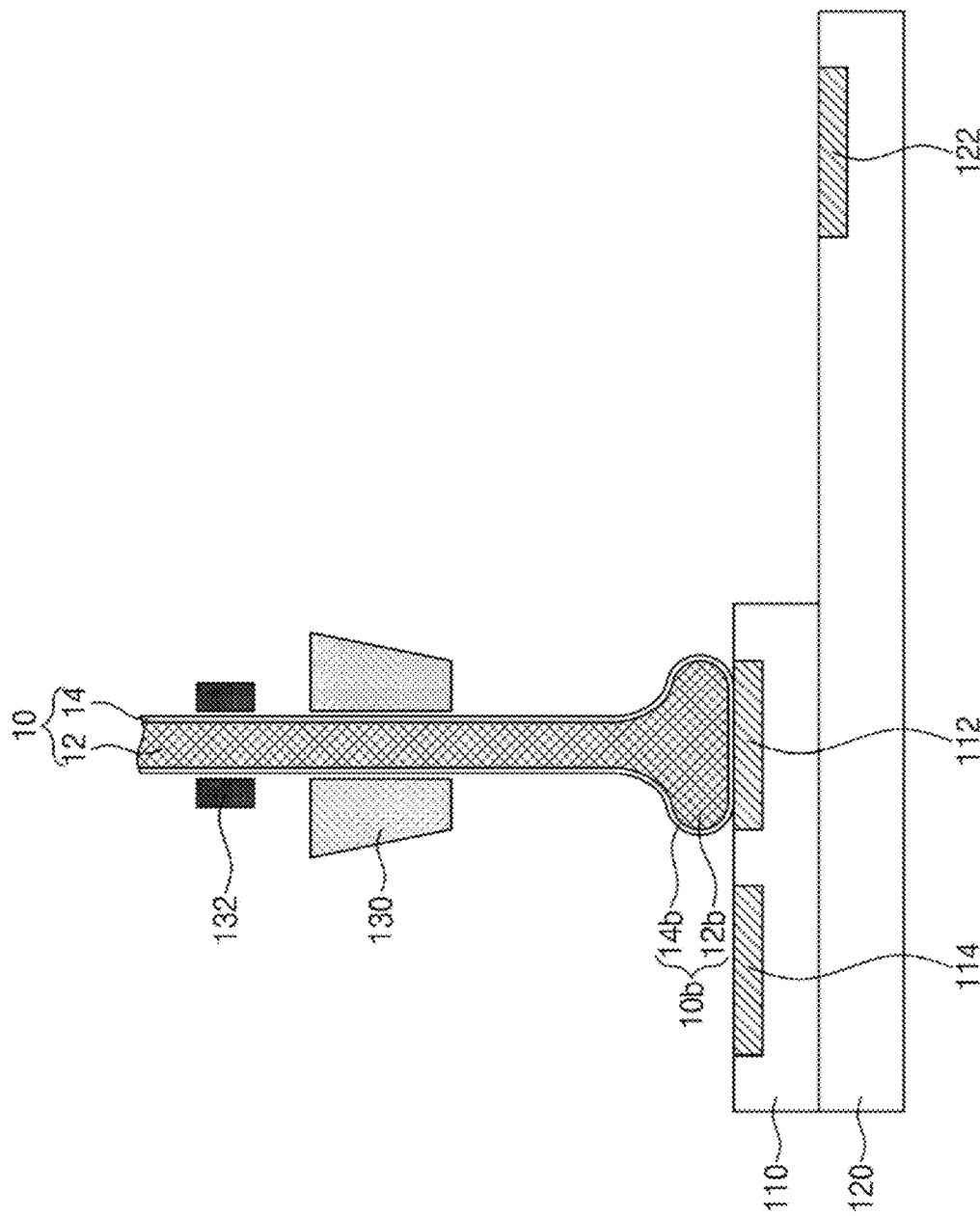

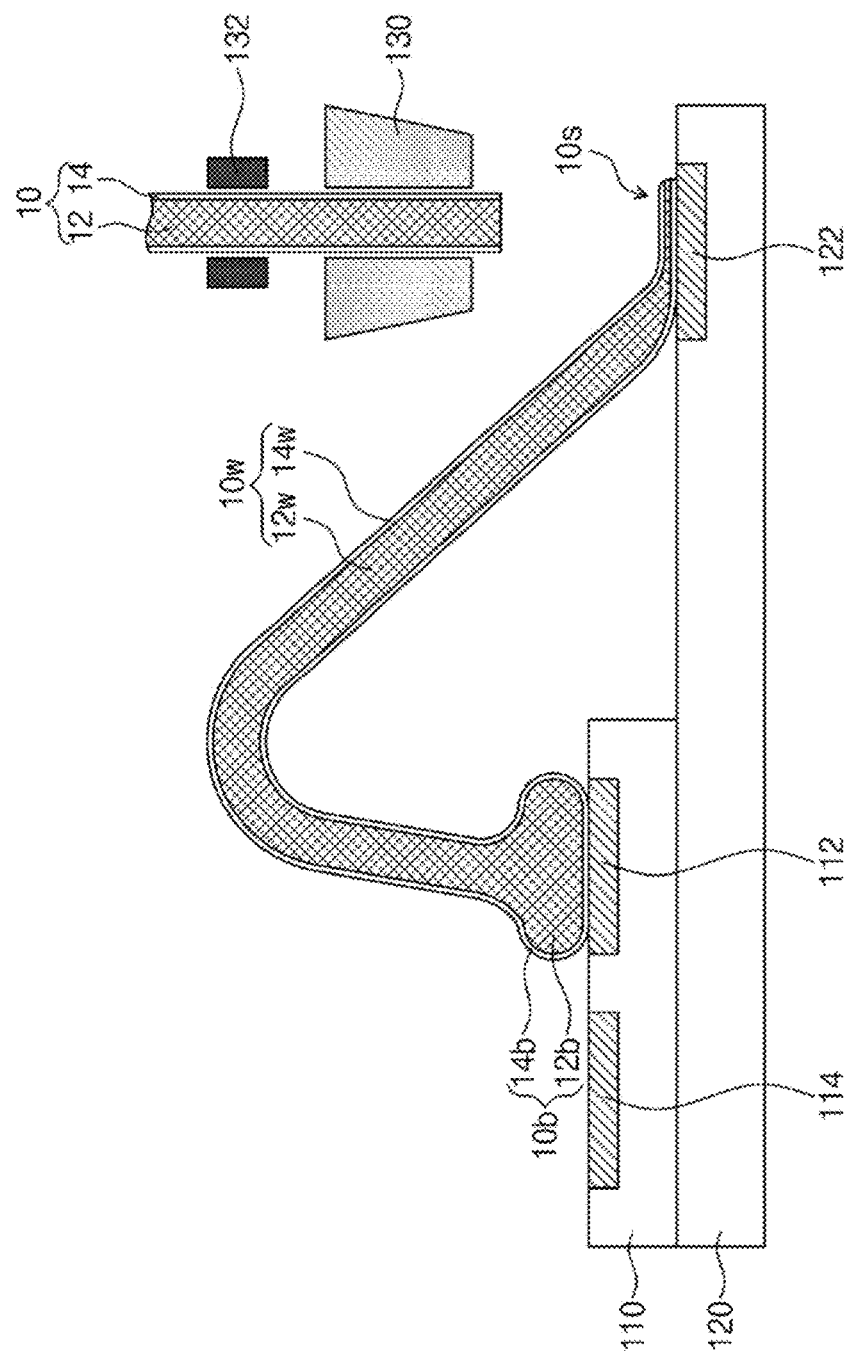

BONDING WIRE HAVING A SILVER ALLOY CORE, WIRE BONDING METHOD USING THE BONDING WIRE, AND ELECTRICAL CONNECTION PART OF SEMICONDUCTOR DEVICE USING THE BONDING WIRE

CROSS-REFERENCE TO RELATED APPLICATION

This U.S. non-provisional patent application claims priority under 35 U.S.C. § 119 to Korean Patent Application No. 10-2016-0092131, filed on Jul. 20, 2016, in the Korean Intellectual Property Office, the disclosure of which is incorporated by reference herein in its entirety; and this U.S. non-provisional patent application claims priority under 35 U.S.C. § 119 to Korean Patent Application No. 10-2017-0059484, filed on May 12, 2017, in the Korean Intellectual Property Office, the disclosure of which is incorporated by reference herein in its entirety.

TECHNICAL FIELD

Exemplary embodiments of the present inventive concept relate to a bonding wire, and more particularly to a wire bonding method using the bonding wire, and an electrical connection part of a semiconductor device using the bonding wire.

DISCUSSION OF RELATED ART

A bonding wire may be used to connect a package substrate to a semiconductor device or to connect a semiconductor device to another semiconductor device. A gold bonding wire may be used as the bonding wire. However, a gold bonding wire may be relatively expensive.

A copper bonding wire has been developed as a substitute of the gold bonding wire. However, when the copper bonding wire is used, a pad crack phenomenon that a pad is damaged during a ball bonding process may occur due to the relatively high hardness of copper. Stitch bonding using the copper bonding wire may be employed; however the stick bonding may be relatively difficult due to the relatively high hardness and strong oxidation property of copper.

SUMMARY

One or more exemplary embodiments of the present inventive concept provide a bonding wire with a reduced manufacturing cost.

One or more exemplary embodiments of the present inventive concept provide a wire bonding method with a reduced process cost and a reduced failure rate.

According to an exemplary embodiment of the present inventive concept, a bonding wire includes a wire core including a silver-palladium alloy, and a coating layer disposed on a sidewall of the wire core. A palladium content of the silver-palladium alloy ranges from about 0.1 wt % to about 1.5 wt %.

According to an exemplary embodiment of the present inventive concept, a bonding wire includes a wire core including a silver-palladium alloy, and a coating layer disposed on a sidewall of the wire core. The coating layer includes gold. A thickness of a thinnest portion of the coating layer is 50 nm or more, and a thickness of a thickest portion of a coating layer is 200 nm or less.

According to an exemplary embodiment of the present inventive concept, an electrical connection part of a semiconductor device includes a device including a first pad and a second pad spaced apart from each other, and a wire structure electrically connecting the first pad to the second pad. The wire structure includes a first bonding portion in contact with the first pad, a second bonding portion in contact with the second pad. A wire loop connects the first bonding portion to the second bonding portion. The wire loop includes a wire core including a silver-palladium alloy, and a coating layer disposed on a sidewall of the wire core. A palladium content of the silver-palladium alloy ranges from about 0.1 wt % to about 1.5 wt %.

According to an exemplary embodiment of the present inventive concept, a wire bonding method includes positioning a capillary, in which a wire is inserted, over a device including a pad. A free air ball is formed at an end of the wire. The free air ball is bonded to the pad. The wire includes a wire core including a silver-palladium alloy, and a coating layer disposed on a sidewall of the wire core. A palladium content of the silver-palladium alloy ranges from about 0.1 wt % to about 1.5 wt %.

BRIEF DESCRIPTION OF THE DRAWINGS

The above and other features of the inventive concept will become more apparent by describing in detail exemplary embodiments thereof, with reference to the accompanying drawings, in which:

FIGS. 5A to 5F illustrate a wire bonding method according to some exemplary embodiments of the present inventive concept.

DETAILED DESCRIPTION OF THE EMBODIMENTS

Figure 1:
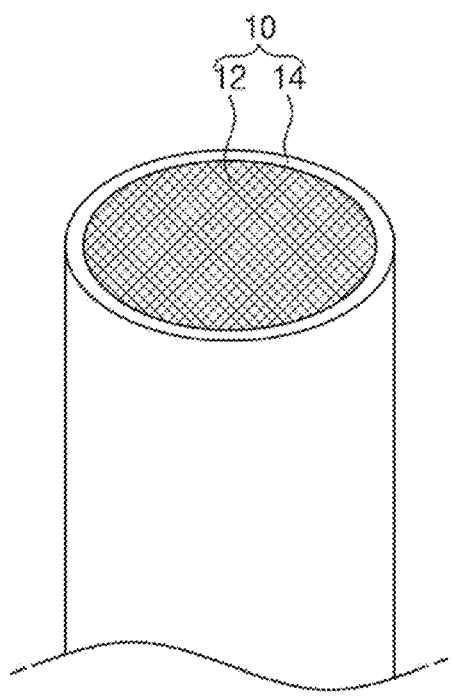
FIG. 1 is a perspective view illustrating a bonding wire according to some exemplary embodiments of the present inventive concept.

Exemplary embodiments of the present inventive concept will be described in more detail with reference to the accompanying drawings. The same reference numerals or the same reference designators may refer to the same elements throughout the specification and drawings.

Figure 2A:
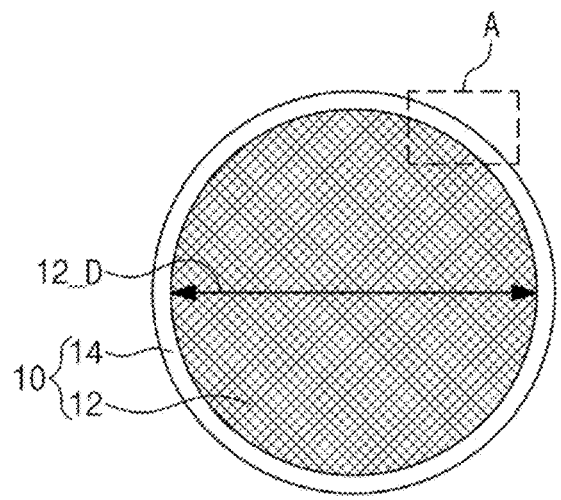
FIG. 2A is a cross-sectional view illustrating a bonding wire according to some exemplary embodiments of the present inventive concept.
Figure 2B:
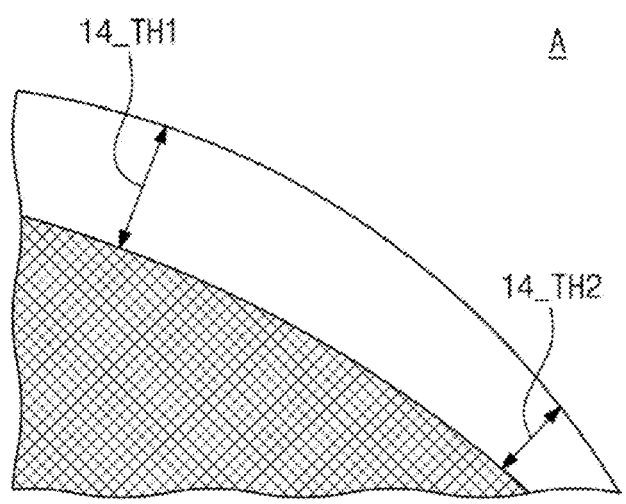
FIG. 2B is an enlarged view of a portion 'A' of FIG. 2A.

FIG. 1 is a perspective view illustrating a bonding wire according to some exemplary embodiments of the present inventive concept. FIG. 2A is a cross-sectional view illustrating a bonding wire according to according to some exemplary embodiments of the present inventive concept. FIG. 2B is an enlarged view of a portion 'A' of FIG. 2A.

Referring to FIGS. 1, 2A, and 2B, a bonding wire 10 may include a wire core 12 and a coating layer 14 disposed on a sidewall of the wire core 12. The coating layer 14 may substantially surround a circumference of the wire core 12.

The wire core 12 may include a silver-palladium alloy. A palladium content of the silver-palladium alloy included in the wire core 12 may range from about 0.1 wt % to about 1.5 wt %. If the palladium content of the silver-palladium alloy is lower than 0.1 wt %, high-temperature/high-humidity reliability of the bonding wire 10 may be reduced. If the palladium content of the silver-palladium alloy is higher than 1.5 wt %, an occurrence rate of deformation of a free air ball (FAB) may be increased in a free air ball-forming process of a wire bonding process. Reliability and deformation of the bonding wire 10 will be described in more detail below with reference, for example, to a table 1. In some exemplary embodiments of the present inventive concept, a cross section of the wire core 12 may have a circular shape, and a diameter 12_D of the wire core 12 may range from about 12 μm to about 20 μm.

The coating layer 14 may include a material of which reactivity to oxygen is lower than that of the silver-palladium alloy included in the wire core 12. Thus, the reactivity of the coating layer 14 to oxygen may be lower than the reactivity of the wire core 12 to oxygen. In some exemplary embodiments of the present inventive concept, the coating layer 14 may include gold, e.g., may include 99.99% or more gold.

A thickness of the coating layer 14 need not be uniform. For example, referring to FIG. 2B, a first thickness 14_TH1 of a portion of the coating layer 14 may be different from a second thickness 14_TH2 of another portion of the coating layer 14. According to some exemplary embodiments of the present inventive concept, a thickness of a specific portion of the coating layer 14 may be defined as the minimum distance between an inner surface and an outer surface of the specific portion of the coating layer 14.

A thickness of the thinnest portion of the coating layer 14 may be about 50 nm or more, and a thickness of the thickest portion of the coating layer 14 may be about 200 nm or less. As an example, the coating layer 14 may have the minimum thickness of 50 nm or more and the maximum thickness of 200 nm or less. If the minimum thickness of the coating layer 14 is smaller than 50 nm, the occurrence rate of the deformation of the free air ball may be increased in the free air ball-forming process. If the maximum thickness of the coating layer 14 is greater than 200 nm, a manufacturing cost of the bonding wire 10 may be increased. In some exemplary embodiments of the present inventive concept, the coating layer 14 may have an average thickness ranging from about 50 nm to about 150 nm.

In some exemplary embodiments of the present inventive concept, forming the coating layer 14 may include forming a preliminary coating layer on the sidewall of the wire core 12, and wire-drawing the wire core 12 on which the preliminary coating layer is formed. The preliminary coating layer may be formed on the sidewall of the wire core 12 by using an electroplating method. However, exemplary embodiments of the present inventive concept are not limited thereto.

According to some exemplary embodiments of the present inventive concept, the bonding wire 10 may include the wire core 12 including the silver-palladium alloy and the coating layer 14 covering the sidewall of the wire core 12. In some exemplary embodiments of the present inventive concept, the coating layer 14 may include gold. The average thickness (e.g., 50 nm to 150 nm) of the coating layer 14 may be sufficiently smaller than the diameter (e.g., 12 μm to 20 μm) of the wire core 12 to reduce or prevent deformation of the free air ball and to reduce manufacturing costs of the bonding wire 10. Thus, the manufacturing costs of the bonding wire 10 according to some exemplary embodiments of the present inventive concept may be lower than that of a bonding wire formed of gold.

Figure 3:
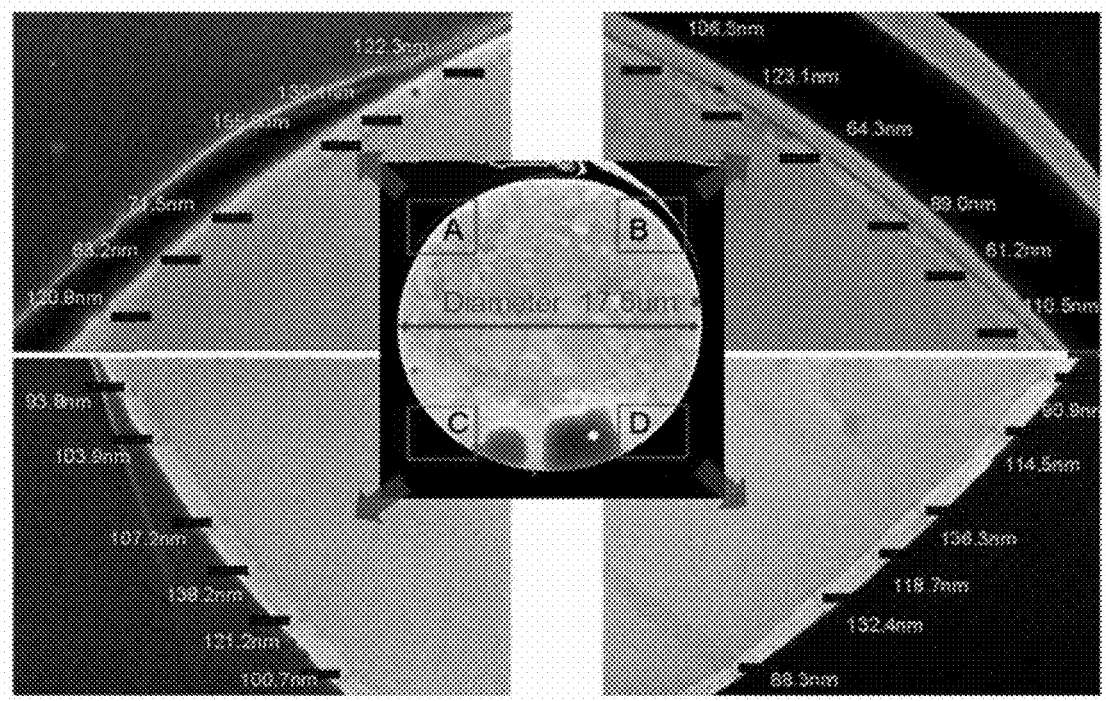
FIG. 3 illustrates a cross-section of a bonding wire according to some exemplary embodiments of the present inventive concept.

FIG. 3 illustrates a cross-section of a bonding wire according to some exemplary embodiments of the present inventive concept. Referring to FIG. 3, the bonding wire may have a diameter of about 17.5 μm. Referring to FIG. 3, among measured thicknesses of the coating layer, a thickness (e.g., the minimum thickness) of the thinnest portion may be about 61.2 nm and a thickness (e.g., the maximum thickness) of the thickest portion may be about 155.8 nm. These thicknesses are included in the thickness ranges of the coating layer 14 described in more detail above with reference to FIGS. 1, 2A, and 2B.

Elements (e.g., components) and effects of some exemplary embodiments of the present inventive concept will be described in more detail below with reference to examples of some exemplary embodiments of the present inventive concept and comparative examples. However, exemplary embodiments of the present inventive concept should not be construed as being limited to the embodiments described herein Some exemplary embodiments of the present inventive concept and the comparative examples may be manufactured by the methods described in more detail below. A diameter of each of bonding wires according to the embodiment examples 1 to 5 and the comparative examples may be about 18 μm.

Embodiment Examples 1 to 9

Each of bonding wires of embodiment examples 1 to 9 may be manufactured to include the wire core including the silver-palladium alloy and the coating layer covering the sidewall of the wire core (see, e.g., FIGS. 1, 2A, and 2B). The palladium (Pd) content of the silver-palladium alloy of the wire core is 0.1 wt % in the embodiment example 1, the palladium content of the silver-palladium alloy is 0.3 wt % in the embodiment example 2, the palladium content of the silver-palladium alloy is 0.5 wt % in the embodiment example 3, the palladium content of the silver-palladium alloy is 0.7 wt % in the embodiment example 4, the palladium content of the silver-palladium alloy is 0.9 wt % in the embodiment example 5, the palladium content of the silver-palladium alloy is 1.0 wt % in the embodiment example 6, the palladium content of the silver-palladium alloy is 1.1 wt % in the embodiment example 7, the palladium content of the silver-palladium alloy is 1.3 wt % in the embodiment example 8, and the palladium content of the silver-palladium alloy is 1.5 wt % in the embodiment example 9. Each of the coating layers of the embodiment examples 1 to 5 includes 99.99% or more gold. A thickness of the thinnest portion of each of the coating layers is 50 nm or more, and a thickness of the thickest portion of each of the coating layers is 200 nm or less.

Comparative Example 1

A bonding wire of a comparative example 1 may include a wire core and a coating layer covering a sidewall of the wire core, similarly to the bonding wire described above with reference to FIGS. 1, 2A, and 2B. However, the wire core of the comparative example 1 includes silver, and not the silver-palladium alloy described above. The coating layer of the comparative example 1 includes 99.99% or more gold. In the comparative example 1, a thickness of the thinnest portion of the coating layer is 50 nm or more and a thickness of the thickest portion of the coating layer is 200 nm or less.

Comparative Examples 2 to 3

Each of bonding wires of comparative examples 2 to 3 may be manufactured to include a wire core including a silver-palladium alloy and a coating layer covering a sidewall of the wire core, similarly to the bonding wire described above with reference to FIGS. 1, 2A, and 2B. A palladium content of the silver-palladium alloy of the comparative example 2 is 1.6 wt %, and a palladium content of the silver-palladium alloy of the comparative example 3 is 2.0 wt %. Each of the coating layers of the comparative examples 2 to 3 includes 99.99% or more gold. A thickness of the thinnest portion of each of the coating layers is 50 nm or more, and a thickness of the thickest portion of each of the coating layers is 200 nm or less.

Comparative Example 4

A bonding wire of a comparative example 4 may have a wire core including a silver-palladium alloy but not a coating layer. A palladium content of the silver-palladium alloy included in the wire core is 2.5 wt % in the comparative example 4.

Physical properties of the embodiment examples and the comparative examples may be evaluated by the following methods.

[Formation State of Free Air Ball]

An electrical spark may be applied to an end of a bonding wire in an unaltered air atmosphere including oxygen of about 21%, thus forming a free air ball. Thereafter, an eccentricity of the formed free air ball may be measured. The eccentricity of the free air ball may be calculated by the following equation 1.

Eccentricity of Free Air Ball=(Length of Long axis−Length of Short axis)/(Length of Short axis)  [Equation 1]

The eccentricity may be expressed as a symbol ⊚ when the eccentricity is equal to or greater than 0 and less than 0.1, the eccentricity may be expressed as a symbol ○ when the eccentricity is equal to or greater than 0.1 and less than 0.25, the eccentricity may be expressed as a symbol Δ when the eccentricity is equal to or greater than 0.25 and less than 0.35, and the eccentricity may be expressed as a symbol X when the eccentricity is equal to or greater than 0.35. The formation state of the free air ball becomes more desirable as the eccentricity of the free air ball decreases.

[Occurrence Rate of Deformation of Free Air Ball]

An electrical spark may be applied to an end of a bonding wire in an unaltered air atmosphere including oxygen of about 21%, thus forming a free air ball. Thereafter, an occurrence rate of deformation of the free air ball may be measured. 2,000 samples may be manufactured for each of the embodiment examples and the comparative examples, and the occurrence rates of the deformation of the free air balls may be measured.

Figure 4A:
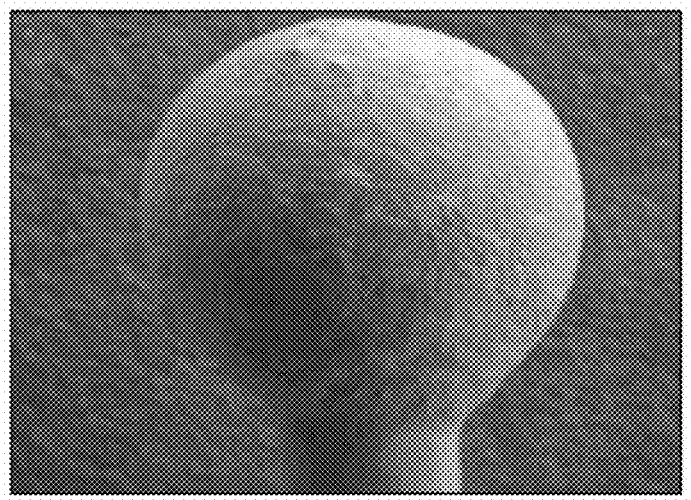
FIG. 4A illustrates a free air ball that is not deformed.
Figure 4B:
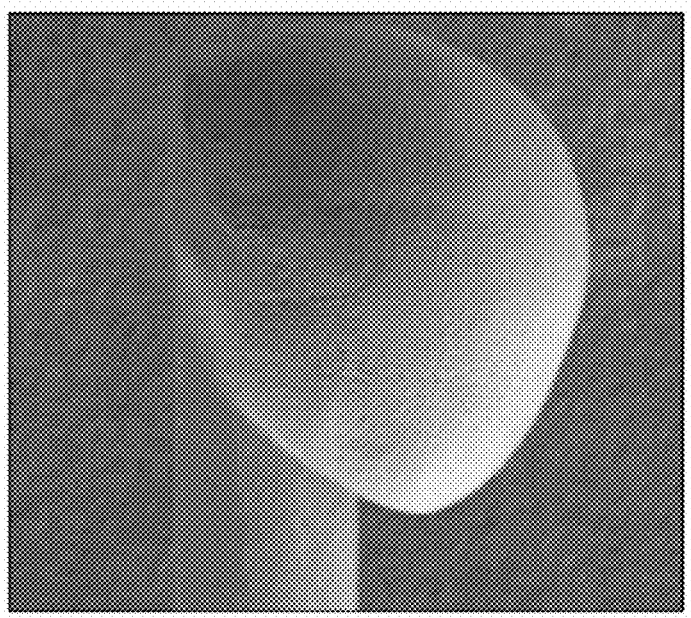
FIG. 4B illustrates a deformed free air ball.

FIG. 4A illustrates a free air ball that is not deformed. FIG. 4B illustrates a deformed free air ball. When a center of the free air ball is aligned with at a central portion of the bonding wire, as shown in FIG. 4A for example, it may be determined that deformation of the free air ball has not occurred. When the center of the free air ball is beyond the central portion of the bonding wire, as shown in FIG. 4B for example, it may be determined that the deformation of the free air ball has occurred.

[High-Temperature/High-Humidity Reliability]

A free air ball may be formed on an end of a bonding wire in an unaltered air atmosphere including oxygen of about 21%, and the free air ball may be bonded to a pad. Thereafter, the free air ball and the pad may be exposed at a temperature of about 85° C. and a humidity of about 85% for a predetermined time, and then, a bond pull test (BPT) may be performed. The bond pull test may be performed by measuring a load when the bonding is broken by pulling the bonding wire.

The high-temperature/high-humidity reliability may be expressed as a symbol ⊚ when the measured load is equal to or greater than 5 g, the high-temperature/high-humidity reliability may be expressed as a symbol ○ when the measured load is equal to or greater than 4 g and less than 5 g, the high-temperature/high-humidity reliability may be expressed as a symbol Δ when the measured load is s equal to or greater than 3 g and less than 4 g, and the high-temperature/high-humidity reliability may be expressed as a symbol X when the measured load is less than 3 g.

The following table 1 shows exemplary results in bonding wires according to some exemplary embodiments of the present inventive concept and the comparative examples by the above described methods.

TABLE 1

| | Kind of bonding wire | Pd content (wt %) | Formation State of FAB | Occurrence Rate of Deformation of FAB (%) | High-temperature/High-humidity Reliability (g) | | |
|---|---|---|---|---|---|---|---|
| | | | | | 12 hours | 14 hours | 30 hours |
| Comparative Example 1 | Au-coated Ag | 0 | ⊚ | 0 | ⊚ | ⊚ | X |
| Embodiment Example 1 | Au-coated Ag—Pd alloy | 0.1 | ⊚ | 0.05 | ⊚ | ⊚ | Δ |
| Embodiment Example 2 | | 0.3 | ⊚ | 0.10 | ⊚ | ⊚ | Δ |
| Embodiment Example 3 | | 0.5 | ⊚ | 0.10 | ⊚ | ⊚ | ○ |
| Embodiment Example 4 | | 0.7 | ⊚ | 0.10 | ⊚ | ⊚ | ○ |
| Embodiment Example 5 | | 0.9 | ⊚ | 0.10 | ⊚ | ⊚ | ○ |
| Embodiment Example 6 | | 1.0 | ⊚ | 0.10 | ⊚ | ⊚ | ○ |

TABLE 1-continued

| | Kind of bonding wire | Pd content (wt %) | Formation State of FAB | Occurrence Rate of Deformation of FAB (%) | High-temperature/High-humidity Reliability (g) | | |
|---|---|---|---|---|---|---|---|
| | | | | | 12 hours | 14 hours | 30 hours |
| Embodiment Example 7 | | 1.1 | ◎ | 0.15 | ◎ | ◎ | ○ |
| Embodiment Example 8 | | 1.3 | ○ | 0.15 | ◎ | ◎ | ○ |
| Embodiment Example 9 | | 1.5 | ○ | 0.15 | ◎ | ◎ | ○ |
| Comparative Example 2 | | 1.6 | △ | 0.50 | ◎ | ◎ | ○ |
| Comparative Example 3 | | 2.0 | X | 1.00 | ◎ | ◎ | ○ |
| Comparative Example 4 | Ag—Pd alloy | 2.5 | X | 5.70 | ○ | X | X |

Comparison of Embodiment Examples 1 to 9 with Comparative Example 1

Referring to the table 1, it can be recognized that the high-temperature/high-humidity reliability of the bonding decreases as the palladium (Pd) content of the wire core of the bonding wire decreases. For example, it can be recognized that the high-temperature/high-humidity reliability of the bonding after the exposure to the high-temperature/high-humidity environment for 30 hours decreases as the palladium content of the wire core of the bonding wire decreases.

In the embodiment examples 1 to 9 of which the palladium contents were in the range of 0.1 wt % to 1.5 wt %, the values of the bond pull test after the exposure to the high-temperature/high-humidity environment for 30 hours may be equal to or greater than 3 g. In the comparative example 1 in which the palladium content of the wire core was lower than 0.1 wt %, the value of the bond pull test after the exposure to the high-temperature/high-humidity environment for 30 hours may be less than 3 g.

Thus, from the exemplary results of the table 1, it can be recognized that the high-temperature/high-humidity reliability of the bonding is increased when the bonding is formed using at least one of the bonding wires of the embodiment examples satisfying the palladium content range of 0.1 wt % to 1.5 wt % in the wire core.

Comparison of Embodiment Examples 1 to 9 with Comparative Examples 2 to 3

Referring to the table 1, it can be recognized that the formation state of the free air ball may become worse as the palladium content of the wire core increases. Referring to the table 1, it can be recognized that the occurrence rate of the deformation of the free air ball may increase as the palladium content of the wire core increases.

In the embodiment examples 1 to 9 in which the palladium contents of the wire cores are in the range of 0.1 wt % to 1.5 wt %, the eccentricities of the free air balls formed in the unaltered air atmosphere including oxygen may be less than 0.25. In the comparative examples 2 and 3 in which the palladium contents of the wire cores is greater than 1.5 wt %, the eccentricities of the free air balls formed in the usual air atmosphere including oxygen may be equal to or greater than 0.25.

In the embodiment examples 1 to 9 in which the palladium contents of the wire cores are in the range of 0.1 wt % to 1.5 wt %, the occurrence rates of the deformation of the free air balls formed in the unaltered air atmosphere including oxygen may be equal to or less than 0.2%. As an example, the occurrence rate of the deformation of the free air ball formed in the unaltered air atmosphere including oxygen may be 0.05% in the embodiment example 1, may be 0.1% in the embodiment examples 2 to 6, and may be 0.15% in the embodiment examples 7 to 9. In the comparative examples 2 to 3 in which the palladium contents of the wire cores are greater than 1.5 wt %, the occurrence rates of the deformation of the free air balls formed in the unaltered air atmosphere including oxygen may be equal to or greater than 0.5%. As an example, the occurrence rate of the deformation of the free air ball formed in the unaltered air atmosphere including oxygen may be 0.5% in the comparative example 2, and may be 1.0% in the comparative example 3.

Thus, from the results of the table 1, it can be recognized that formation probability of the deformed free air ball may be reduced when the free air ball is formed in the unaltered air atmosphere including oxygen by using the bonding wire according to some exemplary embodiments of the present inventive concept satisfying the palladium content range of 0.1 wt % to 1.5 wt % in the wire core.

Comparison of Embodiment Examples 1 to 9 with Comparative Example 4

Referring to the table 1, when bonding is performed using the bonding wire having the wire core including the silver-palladium alloy and the coating layer covering the sidewall of the wire core (e.g., the embodiment examples 1 to 9 and the comparative examples 2 and 3), the high-temperature/high-humidity reliability of the bonding may increase as the palladium content of the silver-palladium alloy increases.

However, even though the palladium content (e.g., 2.5 wt %) of the silver-palladium alloy of the comparative example 4 may be higher than those of the embodiment examples 1 to 9, the high-temperature/high-humidity reliability of the bonding of the comparative example 4 may be reduce. This may be because the wire core having relatively high reactivity is exposed directly to the high-temperature/high-humidity environment since the bonding wire of the comparative example 4 does not have the coating layer.

Thus, from the results of the table 1, it can be recognized that the high-temperature/high-humidity reliability of the bonding may be increased when the bonding is formed using the bonding wire including the coating layer covering the sidewall of the wire core according to some exemplary embodiments of the present inventive concept.

FIGS. 5A to 5F illustrate a wire bonding method according to some exemplary embodiments of the present inventive concept.

Figure 5A:
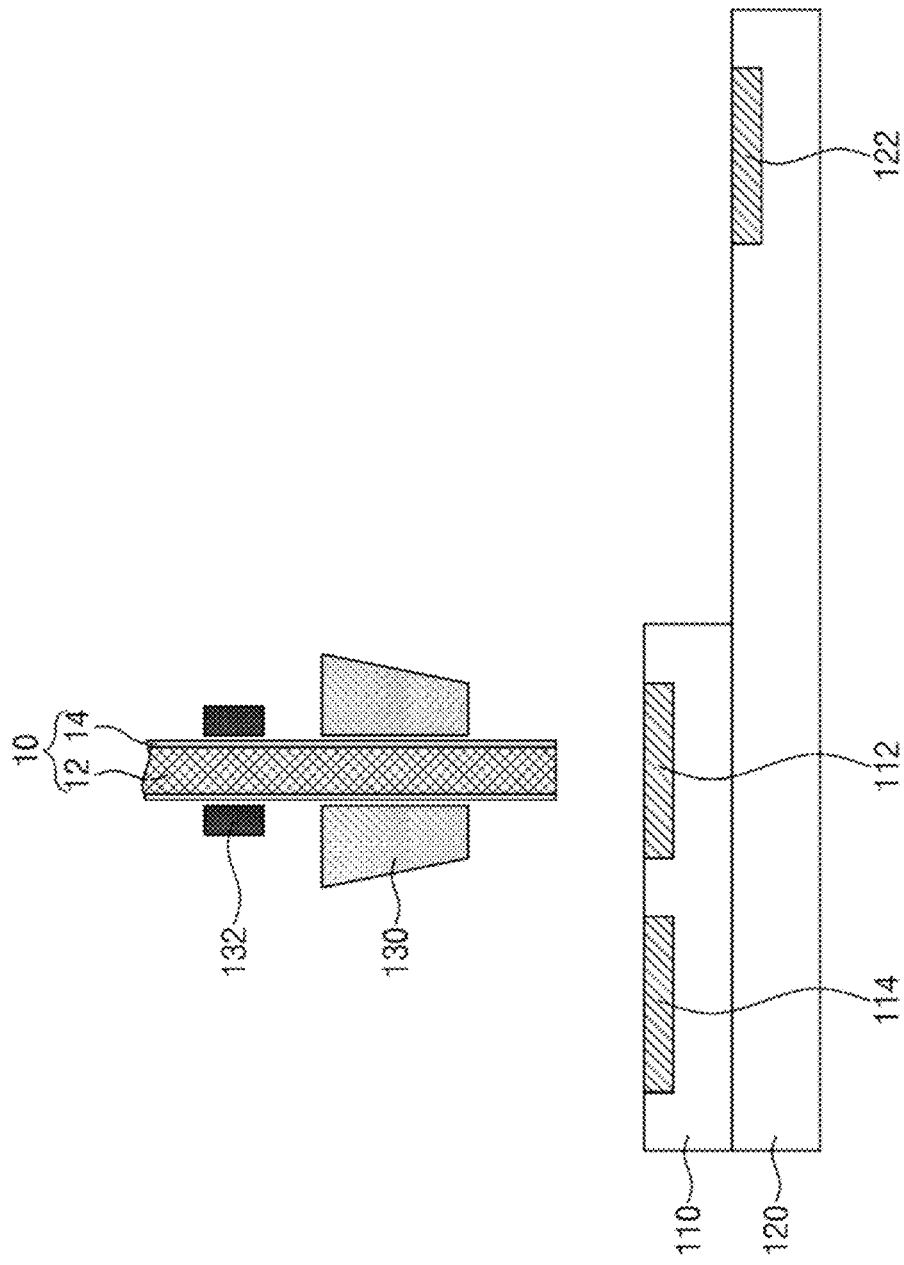

Referring to FIG. 5A, a lower structure may include first to third pads 112, 114, and 122. The first to third pads 112, 114, and 122 may be spaced apart from each other. For example, a first device 110 may include the first and second pads 112 and 114 and a second device 120 may include the third pad 122.

In some exemplary embodiments of the present inventive concept, the first device 110 may be disposed on the second device 120 and may expose the third pad 122. In some exemplary embodiments of the present inventive concept, the first device 110 and the second device 120 may be disposed to be vertically spaced apart from each other. In some exemplary embodiments of the present inventive concept, at least one lateral edge of the first device 110 may be spaced apart from at least one lateral edge of the second device 120. In some exemplary embodiments of the present inventive concept, the first device 110 and the second device 120 may be laterally spaced apart from each other.

In some exemplary embodiments of the present inventive concept, one of the first and second devices 110 and 120 may be a semiconductor chip and the other of the first and second devices 110 and 120 may be a package substrate. For example, the first device 110 may be the semiconductor chip, and the second device 120 may be the package substrate. In some exemplary embodiments of the present inventive concept, the first and second devices 110 and 120 may be semiconductor chips. For example, the first and second devices 110 and 120 may be the same types of semiconductor chips, or may be different types of semiconductor chips. For example, the first device 110 may be a memory chip and the second device 120 may be a logic chip.

A capillary 130 in which a bonding wire 10 is disposed may be positioned over the first pad 112. The bonding wire 10 may pass through a substantially central hole of the capillary 130, and thus a bottom end of the bonding wire 10 may protrude from a bottom surface of the capillary 130. A clamp 132 may be positioned above or on the capillary 130, and the bonding wire 10 may pass through the clamp 132. The clamp 132 may be in a closed state, and thus the bonding wire 10 may be fixed to the clamp 132.

The bonding wire 10 may include the wire core 12 and the coating layer 14 covering a sidewall of the wire core 12. The bonding wire 10 may be the substantially same as the bonding wire described in more detail above with reference to FIGS. 1, 2A, and 2B, and thus duplicative descriptions may be omitted.

Figure 5B:
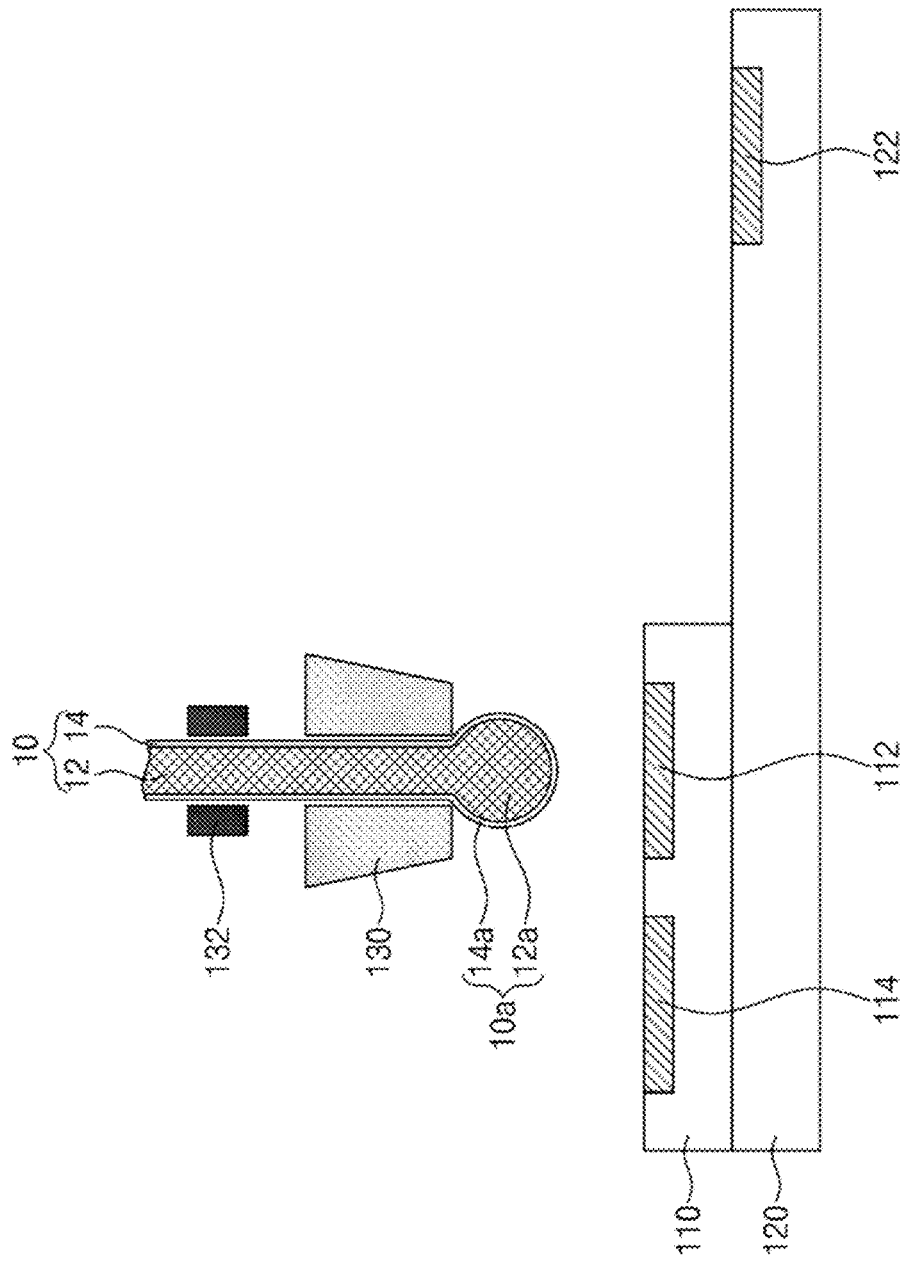

Referring to FIG. 5B, a free air ball 10a may be formed at an end (e.g., the bottom end) of the bonding wire 10. The formation of the free air ball 10a may be performed by applying an electrical spark to the end of the bonding wire 10.

In some exemplary embodiments of the present inventive concept, applying the electrical spark to the end of the bonding wire 10 may be performed in an air atmosphere including oxygen of 15% to 25%. For example, applying the electrical spark to the end of the bonding wire 10 may be performed in an unaltered air atmosphere including oxygen of about 21%. As described in more detail above with reference to the table 1, the eccentricity of the free air ball 10a according to some exemplary embodiments of the present inventive concept may be less than 0.25.

The free air ball 10a may include a ball core portion 12a and a ball coating portion 14a. The wire core 12 may be melted by the electrical spark and then may be cooled to form the ball core portion 12a, and the coating layer 14 may be melted by the electrical spark and then may be cooled to form the ball coating portion 14a. Thus, the ball core portion 12a may be connected to the wire core 12, and the ball coating portion 14a may be connected to the coating layer 14. The ball coating portion 14a may be formed to cover a surface of the ball core portion 12a, and thus the surface of the ball core portion 12a need not be exposed.

Figure 6:
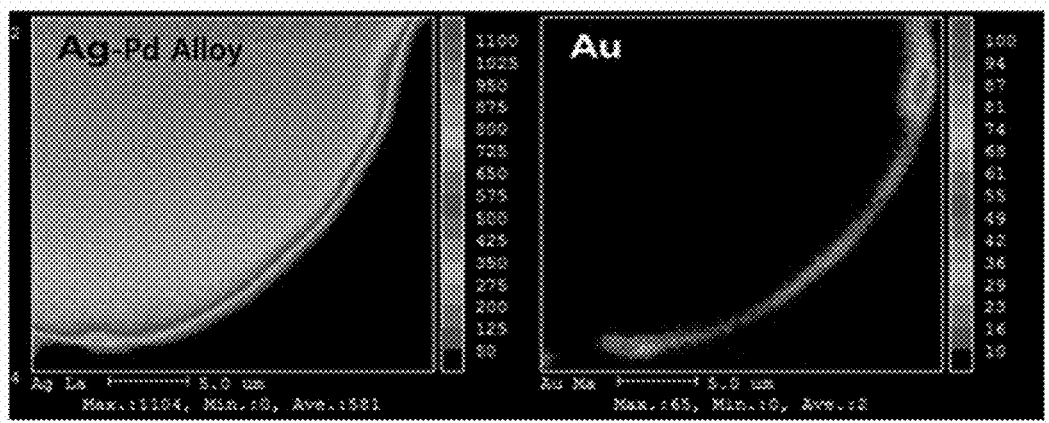
FIG. 6 illustrates a portion of a free air ball formed using a bonding wire according to some exemplary embodiments of the present inventive concept.

FIG. 6 illustrates a portion of a free air ball formed using a bonding wire according to some exemplary embodiments of the present inventive concept. Referring to FIG. 6, the coating layer of the bonding wire may include 99.99% or more gold. The free air ball may be formed by applying the electrical spark to the end of the bonding wire in the unaltered air atmosphere including oxygen of about 21%. Referring to FIG. 6, the ball coating portion of the free air ball formed in the unaltered air atmosphere may cover the surface of the ball core portion.

In general, if a free air ball is formed in an unaltered air atmosphere at an end of a bonding wire including a silver-palladium alloy, the silver-palladium alloy may react with oxygen to increase the occurrence rate of the deformation of the free air ball (e.g., a deformation rate of 0.5% or more). To prevent the formation of the deformed free air ball, the free air ball may be generally formed in a nitrogen atmosphere (e.g., an atmosphere including nitrogen and hydrogen). However, according to some exemplary embodiments of the present inventive concept, the occurrence rate of the deformation of the free air ball 10a can be reduced (e.g., to a deformation rate of 0.2% or less) even though the process of forming the free air ball 10a is performed in the unaltered air atmosphere. Thus, according to some exemplary embodiments of the present inventive concept, the process of forming the free air ball 10a may be simplified and a manufacturing cost of forming the free air ball 10a may be reduced.

Referring to FIG. 5C, a ball bonding portion 10b may be formed on the first pad 112. The ball bonding portion 10b may be formed by bonding the free air ball 10a to the first pad 112 by using an ultrasonic welding process. As an example, forming the ball bonding portion 10b may include moving the capillary 130 toward the first pad 112 to press the free air ball 10a on the first pad 112, and applying heat and/or ultrasonic vibrations to the free air ball 10a.

The ball bonding portion 10b may include a ball bonding core portion 12b and a ball bonding coating portion 14b. The ball core portion 12a of the free air ball 10a may be pressed to form the ball bonding core portion 12b, and the ball coating portion 14a of the free air ball 10a may be pressed to form the ball bonding coating portion 14b.

In some exemplary embodiments of the present inventive concept, the ball bonding coating portion 14b may disposed on and may substantially cover a surface (e.g., an upper surface) of the ball bonding core portion 12b. Thus, the ball bonding coating portion 14b may be in direct contact with the first pad 112, and the ball bonding core portion 12b may be spaced apart from the first pad 112 by the ball bonding portion. However, exemplary embodiments of the present inventive concept are not limited thereto. In some exemplary embodiments of the present inventive concept, the ball bonding core portion 12b may be in direct contact with the first pad 112, and the ball bonding coating portion 14b may disposed only on a sidewall of the ball bonding core portion 12b. This may be because a portion of the ball coating portion 14a between the ball bonding core portion 12b and the first pad 112 may be laterally pushed by pressure applied by the ultrasonic welding process.

If the ball bonding process described above in more detail is performed using a deformed free air ball, the deformed free air ball may be in contact with a neighboring pad (e.g., the second pad 114) as well as a desired pad (e.g., the first pad 112). Thus, an electrical short may occur between the pads (e.g., the first and second pads 112 and 114) adjacent to each other. However, according to some exemplary embodiments of the present inventive concept, the occurrence rate of the deformation of the free air ball 10a can be reduced (e.g., to a deformation rate of 0.2% or less) even though the process of forming the free air ball 10a is performed in the unaltered air atmosphere. Thus, according to some exemplary embodiments of the present inventive concept, an occurrence of the electrical short between adjacent pads may be reduced or prevented.

Referring to FIG. 5D, the capillary 130 may be moved in a direction away from the first pad 112. The clamp 132 may be in an opened state when the capillary 130 is moved. By the movement of the capillary 130, the bonding wire 10 may have a shape vertically extending from the ball bonding portion 10b bonded to the first pad 112.

Figure 5E:
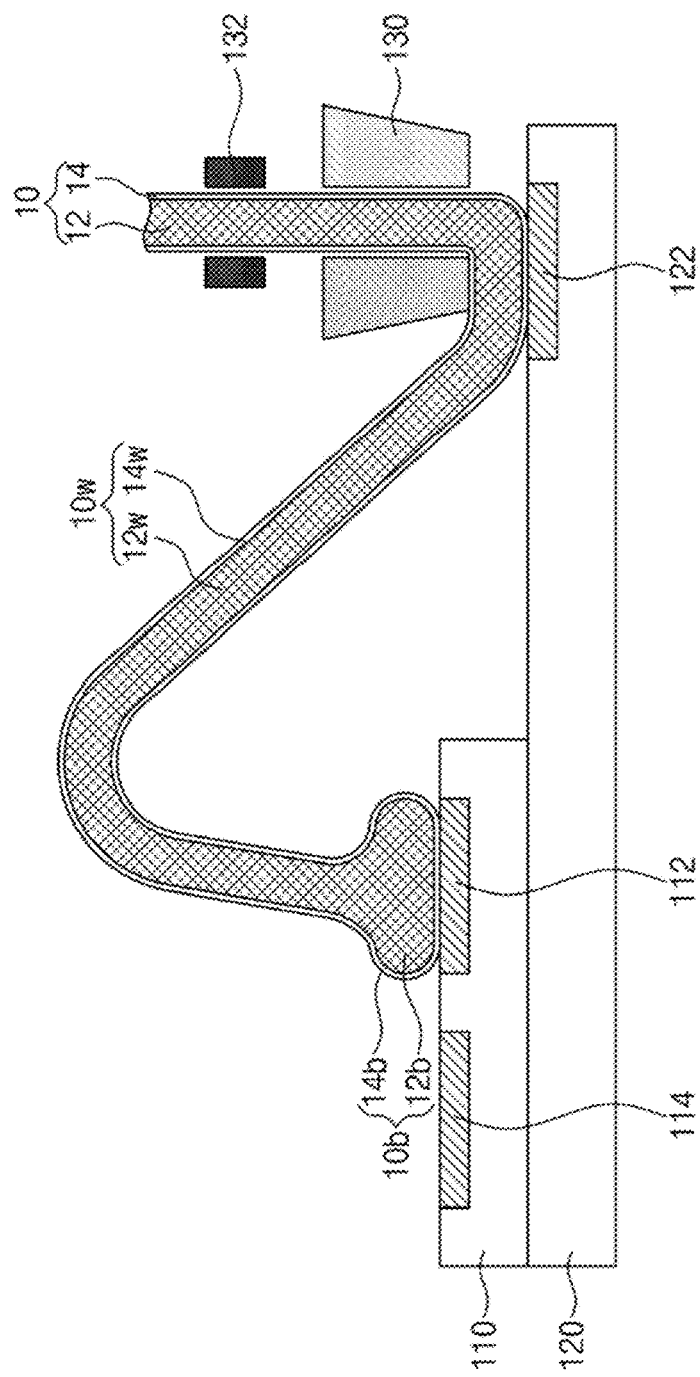

Referring to FIG. 5E, a wire loop 10w may be formed between the first pad 112 and the third pad 122. The formation of the wire loop 10w may be performed by sliding the capillary 130 onto the third pad 122. The clamp 132 may be in an opened state when the capillary 130 is slid. As an example, since the capillary 130 is slid, the bonding wire 10 passing through the central hole of the capillary 130 may extend along the sliding of the capillary 130. Thus, the wire loop 10w may be formed to extend from the ball bonding portion 10b onto the third pad 122.

The wire loop 10w may include a loop core portion 12w and a loop coating portion 14w covering a sidewall of the loop core portion 12w. The wire loop 10w may correspond to an extending portion of the bonding wire 10. As an example, the loop core portion 12w may correspond to an extending portion of the wire core 12 of the bonding wire 10, and the loop coating portion 14w may correspond to an extending portion of the coating layer 14 of the bonding wire 10.

Referring to FIG. 5F, a stitch bonding portion 10s may be formed on the third pad 122 by a stitch bonding process. The stitch bonding portion 10s may be electrically connected to the ball bonding portion 10b through the wire loop 10w, and thus wire bonding may be realized between the first pad 112 and the third pad 122. After the formation of the stitch bonding portion 10s, the capillary 130 may be moved in a direction away from the third pad 122. The clamp 132 may be in a closed state when the capillary 130 is moved.

Figure 7:
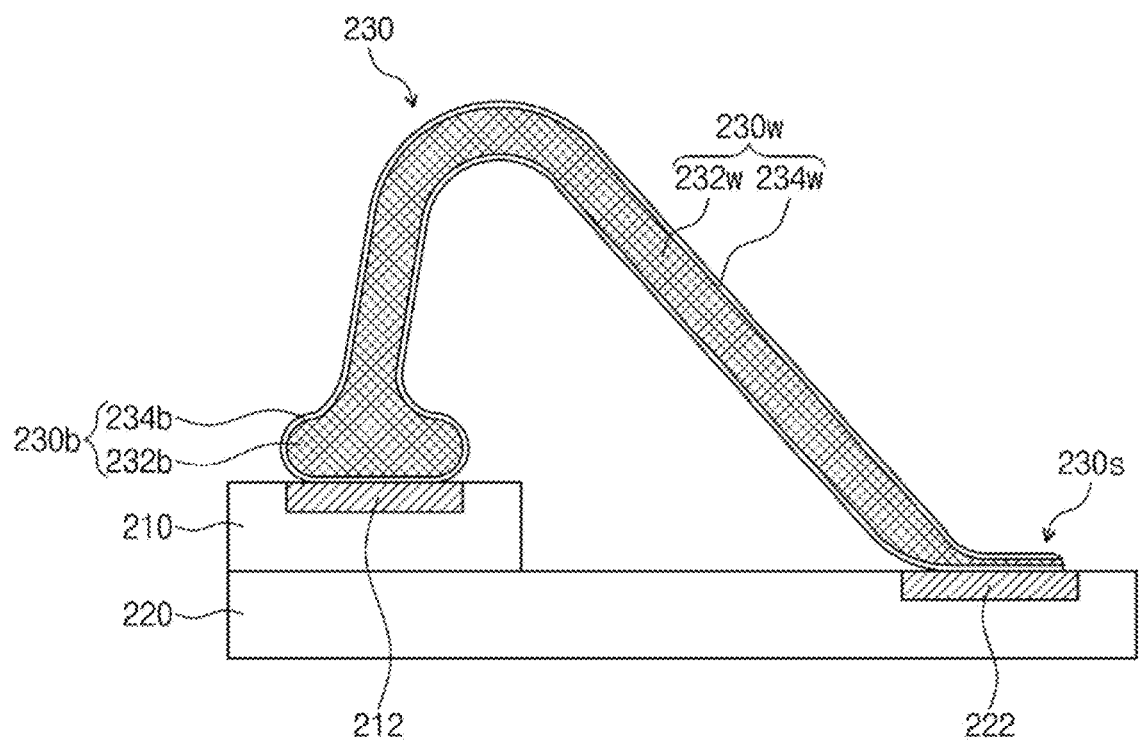
FIG. 7 illustrates an electrical connection part of a semiconductor device according to some exemplary embodiments of the present inventive concept.

FIG. 7 illustrates an electrical connection part of a semiconductor device according to some exemplary embodiments of the present inventive concept.

Referring to FIG. 7, a lower structure may include first and second pads 212 and 222. The first and second pads 212 and 222 may be spaced apart from each other. For example, a first device 210 may include the first pad 212 and a second device 220 may include the second pad 222.

In some exemplary embodiments of the present inventive concept, the first device 210 may be disposed on the second device 220 and may expose the second pad 222. In some exemplary embodiments of the present inventive concept, the first device 210 and the second device 220 may be vertically spaced apart from each other. In some exemplary embodiments of the present inventive concept, the first device 210 and the second device 220 may be laterally spaced apart from each other.

In some exemplary embodiments of the present inventive concept, one of the first and second devices 210 and 220 may be a semiconductor chip and the other of the first and second devices 210 and 220 may be a package substrate. For example, the first device 210 may be the semiconductor chip, and the second device 220 may be the package substrate. In some exemplary embodiments of the present inventive concept, the first and second devices 210 and 220 may be semiconductor chips For example, the first and second devices 210 and 220 may be the same types of semiconductor chips, or may be different types of semiconductor chips. For example, the first device 210 may be a memory chip and the second device 220 may be a logic chip.

A bonding structure 230 may electrically connect the first pad 212 to the second pad 222. The bonding structure 230 may include a ball bonding portion 230b, a stitch bonding portion 230s, and a wire loop 230w connecting the ball bonding portion 230b to the stitch bonding portion 230s.

The wire loop 230w may include a wire core 232w and a coating layer 234w disposed on a sidewall of the wire core 232w. The coating layer 234w may cover substantially an entire sidewall of the wire core 232w. The wire loop 230w may be substantially the same as the bonding wire 10 described in more detail above, and thus duplicative descriptions may be omitted.

The ball and stitch bonding portions 230b and 230s may be disposed on the first and second pads 212 and 222, respectively. In some exemplary embodiments of the present inventive concept, the ball bonding portion 230b may be disposed on the first pad 212, and the stitch bonding portion 230s may be disposed on the second pad 222. In some exemplary embodiments of the present inventive concept, the stitch bonding portion 230s may be disposed on the first pad 212, and the ball bonding portion 230b may be disposed on the second pad 222. An exemplary embodiment of the present inventive concept in which the ball bonding portion 230b is disposed on the first pad 212, and the stitch bonding portion 230s is disposed on the second pad 222 will be described in more detail below; however, exemplary embodiments of the present inventive concept are not limited thereto.

The ball bonding portion 230b may include a ball bonding core portion 232b and a ball bonding coating portion 234b. The ball bonding core portion 232b may be connected to the wire core 232w, and the ball bonding coating portion 234b may be connected to the coating layer 234w.

The ball bonding core portion 232b may include substantially a same material or materials as the wire core 232w, and the ball bonding coating portion 234b may include substantially the same material or materials as the coating layer 234w. As an example, the ball bonding core portion 232b may include a silver-palladium alloy, and a palladium content of the silver-palladium alloy may range from about 0.1 wt % to about 1.5 wt %. The ball bonding coating portion 234b may include a material of which reactivity to oxygen is lower than that of the silver-palladium alloy included in the ball bonding core portion 232b. In some exemplary embodiments of the present inventive concept, the ball bonding coating portion 234b may include gold, e.g., 99.99% or more gold.

In some exemplary embodiments of the present inventive concept, the ball bonding coating portion 234b may be disposed on a surface of the ball bonding core portion 232b and may cover substantially an entire surface of the ball bonding core portion 232b. Thus, the ball bonding coating portion 234b may be in direct contact with the first pad 212, and the ball bonding core portion 232b may be spaced apart from the first pad 212. In some exemplary embodiments of the present inventive concept, the ball bonding core portion 232b may be in direct contact with the first pad 212, and the ball bonding coating portion 234b may cover only a sidewall of the ball bonding core portion 232b.

According to some exemplary embodiments of the present inventive concept, the bonding wire may include the wire core including the silver-palladium alloy and the coating layer covering the sidewall of the wire core. In some exemplary embodiments of the present inventive concept, the coating layer may include gold, but the average thickness of the coating layer may be relatively smaller than the diameter of the wire core. Thus, manufacturing costs of the bonding wire according to some exemplary embodiments of the present inventive concept may be lower than that of a bonding wire formed of gold.

In general, if a bonding wire is formed of a silver-palladium alloy, a free air ball will be formed in a nitrogen atmosphere (e.g., an atmosphere including nitrogen and hydrogen) to prevent the free air ball from being deformed. However, according to some exemplary embodiments of the present inventive concept, the occurrence rate of the deformation of the free air ball can be reduced (e.g., to a deformation rate of 0.2% or less) even though the process of forming the free air ball is performed in an unaltered air atmosphere. Thus, according to some exemplary embodiments of the present inventive concept, the process of forming the free air ball may be simplified, and a cost of the process of forming the free air ball may be reduced.

If a bonding process is performed using a deformed free air ball, the deformed free air ball may be in contact with a desired pad and another pad adjacent to the desired pad. Thus, an electrical short may occur between pads adjacent to each other. However, according to some exemplary embodiments of the present inventive concept, the occurrence rate of the deformation of the free air ball can be reduced (e.g., to a deformation rate of 0.2% or less) even though the process of forming the free air ball is performed in an unaltered air atmosphere. Thus, an occurrence of the electrical short between adjacent pads may be reduced or prevented by the wire bonding method according to some exemplary embodiments of the present inventive concept.

While the inventive concept has been particularly shown and described with reference to exemplary embodiments thereof, it will be understood by those of ordinary skill in the art that various changes in form and detail may be made therein without departing from the spirit and scope of the inventive concept.

What is claimed is:

1. A bonding wire comprising:
a wire core including a silver-palladium alloy comprising silver and palladium; and
a coating layer disposed on a sidewall of the wire core,
wherein a palladium content of the silver-palladium alloy ranges from 0.1 wt % to 1.5 wt %,
wherein the bonding wire further comprises a free air ball formed on one end thereof, and
wherein the free air ball has an eccentricity, defined as a difference between a length of a long axis thereof and a length of a short axis thereof divided by the length of the short axis thereof, that is less than 0.25 and greater than 0.

2. The bonding wire of claim 1, wherein a reactivity of the coating layer to oxygen is lower than a reactivity of the wire core to oxygen.

3. The bonding wire of claim 1, wherein the coating layer includes gold.

4. The bonding wire of claim 3, wherein a gold content of the coating layer is 99.99% or higher.

5. The bonding wire of claim 1, wherein an average thickness of the coating layer ranges from 50 nm to 150 nm.

6. The bonding wire of claim 1,
wherein the coating layer has a non-uniform thickness,
wherein a thickness of a thinnest portion of the coating layer is 50 nm or more, and
wherein a thickness of a thickest portion of the coating layer is 200 nm or less.

7. The bonding wire of claim 1, wherein a diameter of the wire core ranges from 12 μm to 20 μm.

8. A bonding wire comprising:
a wire core including a silver-palladium alloy comprising silver and palladium; and
a coating layer disposed on a sidewall of the wire core, the coating layer including gold,
wherein the coating layer has a non-uniform thickness,
wherein a thickness of a thinnest portion of the coating layer is 50 nm or more, and
wherein a thickness of a thickest portion of the coating layer is 200 nm or less,
wherein the bonding wire further comprises a free air ball formed on one end thereof, and
wherein the free air ball has an eccentricity, defined as a difference between a length of a long axis thereof and a length of a short axis thereof divided by the length of the short axis thereof, that is less than 0.25 and greater than 0.

9. The bonding wire of claim 8, wherein a palladium content of the silver-palladium alloy ranges from 0.1 wt % to 1.5 wt %.

10. The bonding wire of claim 8, wherein the coating layer includes 99.99% or more gold.

11. The bonding wire of claim 8, wherein an average thickness of the coating layer ranges from 50 nm to 150 nm.

12. The bonding wire of claim 8, wherein a diameter of the wire core ranges from 12 μm to 20 μm.

13. An electrical connection part of a semiconductor device, comprising:
a device including a first pad and a second pad spaced apart from each other; and
a wire structure electrically connecting the first pad to the second pad,
wherein the wire structure comprises:
a first bonding portion in contact with the first pad;
a second bonding portion in contact with the second pad; and
a wire loop connecting the first bonding portion to the second bonding portion,
wherein the wire loop comprises:
a wire core including a silver-palladium alloy comprising silver and palladium; and
a coating layer disposed on a sidewall of the wire core,
wherein a palladium content of the silver-palladium alloy ranges from 0.1 wt % to 1.5 wt %,
wherein the bonding wire further comprises a free air ball formed on one end thereof, and
wherein the free air ball has an eccentricity, defined as a difference between a length of a long axis thereof and a length of a short axis there divided by the length of the short axis thereof, that is less than 0.25 and greater than 0.

14. The electrical connection part of a semiconductor device of claim 13, wherein the coating layer includes 99.99% or more gold.

15. The electrical connection part of a semiconductor device of claim 13, wherein an average thickness of the coating layer ranges from 50 nm to 150 nm.

16. The electrical connection part of a semiconductor device of claim 13,
   wherein the coating layer has a non-uniform thickness,
   wherein a thickness of a thinnest portion of the coating layer is 50 nm or more, and
   wherein a thickness of a thickest portion of the coating layer is 200 nm or less.

17. The electrical connection part of a semiconductor device of claim 13, wherein one of the first and second bonding portions comprises:
   a ball bonding core portion connected to the wire core; and
   a ball bonding coating portion connected to the coating layer.

18. The electrical connection part of a semiconductor device of claim 17, wherein the ball bonding coating portion is disposed on the ball bonding core portion.

19. The electrical connection part of a semiconductor device of claim 17,
   wherein the ball bonding core portion includes a silver-palladium alloy having a palladium content of from 0.1 wt % to 1.5 wt %, and
   wherein the ball bonding coating portion includes gold.

* * * * *